United States Patent [19]

Kunze et al.

[11] Patent Number: 4,849,663
[45] Date of Patent: Jul. 18, 1989

[54] SWITCHABLE SMOOTHING NETWORK

[75] Inventors: Dieter Kunze, Kaltenkirchen; Gerd Onken, Norderstedt; Jörg Wölber, Pinneberg, all of Fed. Rep. of Germany

[73] Assignee: U.S. Philips Corporation, New York, N.Y.

[21] Appl. No.: 294,964

[22] Filed: Jan. 6, 1989

Related U.S. Application Data

[63] Continuation of Ser. No. 865,937, May 16, 1986, abandoned, which is a continuation of Ser. No. 435,001, Oct. 18, 1982, abandoned.

[30] Foreign Application Priority Data

Oct. 28, 1981 [DE] Fed. Rep. of Germany ....... 3142612

[51] Int. Cl.[4] .............................................. H03B 1/00
[52] U.S. Cl. .................................... 307/521; 307/543; 328/167; 328/162; 331/17
[58] Field of Search ............. 307/520, 521, 542, 543, 307/556, 558; 328/162, 167; 331/17; 330/302, 303

[56] References Cited

U.S. PATENT DOCUMENTS

| | | | |
|---|---|---|---|
| 2,828,419 | 3/1958 | Gruen | 331/17 |
| 3,287,657 | 11/1966 | Widl | 331/17 |
| 3,408,590 | 10/1968 | Moschytz | 330/85 |
| 3,893,034 | 7/1975 | Willhite | 328/167 |
| 4,007,429 | 2/1977 | Cadalora et al. | 331/17 |
| 4,142,110 | 2/1979 | Weber | 307/552 |
| 4,156,855 | 5/1979 | Crowley | 331/17 |
| 4,260,968 | 4/1981 | Haigh et al. | 307/520 |
| 4,482,869 | 11/1984 | Hirata | 331/17 |
| 4,540,946 | 9/1985 | Sainz et al. | 307/520 |

FOREIGN PATENT DOCUMENTS 2159223 6/1973 Fed. Rep. of Germany .

Primary Examiner—Stanley D. Miller
Assistant Examiner—Timothy P. Callahan
Attorney, Agent, or Firm—Edward W. Goodman

[57] ABSTRACT

A circuit arrangement for transferring a d.c. voltage via a smoothing network including a capacitor which can be switched to prevent a surge in the transferred signal from occurring. The voltage from the output terminal is applied to the capacitor in the changed-over state via an amplifier having a high input impedance and a gain factor of substantially 1.

2 Claims, 1 Drawing Sheet

4,849,663

SWITCHABLE SMOOTHING NETWORK

This is a continuation of application Ser. No. 865,937, filed May 16, 1986, which is a continuation of application Ser. No. 435,001, filed Oct. 18, 1982, both now abandoned.

BACKGROUND OF THE INVENTION

The invention relates to a circuit arrangement for transferring a d.c. voltage, the circuit arrangement comprising a switchable smoothing network arranged between an input and an output terminal and operative with respect to a reference potential, the smoothing network comprising at least a series resistor and connected thereto a parallel branch formed by a first capacitor, which may be arranged in series with a first resistor, and a second capacitor, which may be arranged in series with a second resistor, and which is connectable to the output terminal for increasing the time constant of the smoothing network.

In known circuits of this type which can be used, for example, to control a voltage-controlled oscillator, a varying voltage is usually transferred. When the second capacitor is disconnected there is, as a rule, a voltage across it which differs from the voltage across the first capacitor. As soon as the second capacitor is switched into the circuit, a charging or discharging current flows to it, and in correspondence therewith, a voltage jump is produced which acts on the transferred voltage and may have detrimental results. For example, the oscillator may be brought outside its pull-in range, which produces a new change-over. The oscillator pulls-in again, etc. It takes quite a long period of time before the control circuits have definitely changed over to the slow time constant.

SUMMARY OF THE INVENTION

The invention has for its object to prevent this voltage jump from occurring. To this end, the circuit arrangement according to the invention is characterized in that the input of an amplifier having a high input impedance and a gain factor of substantially 1, is connected to the output terminal, the amplifier output being connected to the second capacitor.

In accordance with a preferred embodiment, the output of the amplifier is connected to one terminal of a change-over switch whose switchable contact is connected to the second capacitor and whose other terminal is connected to the output terminal of the smoothing filter.

In accordance with a further preferred embodiment, the second capacitor is connected to the output terminal via the second resistor, the amplifier being connected in parallel with the second resistor, said amplifier being switchable between a gain factor of substantially zero and substantially 1. In that event, a change-over switch is not required in the smoothing capacitor branch; the change-over is effected by a control quantity which switches the amplifier between the gain factors 1 and zero. In the first case, the voltage of the second capacitor is controlled together with the voltage of the first capacitor, so that no current flows across the second resistor and the second resistor is inoperative for the smoothing filter. In the second case, the second capacitor is connected to the smoothing filter via the resistor. There is no need for this resistor to have a high resistance value, but it must have such a resistance value that the second capacitor is practically directly connected to the output terminal.

For the sake of completeness, it should be noted that from German Patent Application No. 2,159,223, it is known to arrange in parallel with a resistor provided in the series branch of the smoothing filter, a transistor amplifier which operates as a switch and to apply a switching signal to this amplifier. When this amplifier is inoperative, the series resistor is fully connected into the smoothing filter. When, in contrast therewith, the switching amplifier carries current, a further resistive branch is arranged in parallel with the series resistor in such a manner that the effective resistance value is significantly reduced and that consequently the cut-off frequency of the smoothing filter is correspondingly increased. As this series resistor can also carry current, a voltage surge of the transferred d.c. voltage is not prevented from occurring. In addition, the series impedance of the smoothing filter is changed, which may be unwanted.

DESCRIPTION OF THE DRAWING

The invention will now be further described by way of example with reference to the accompanying drawing. Herein

DESCRIPTION OF THE PREFERRED EMBODIMENT

Figure 1:
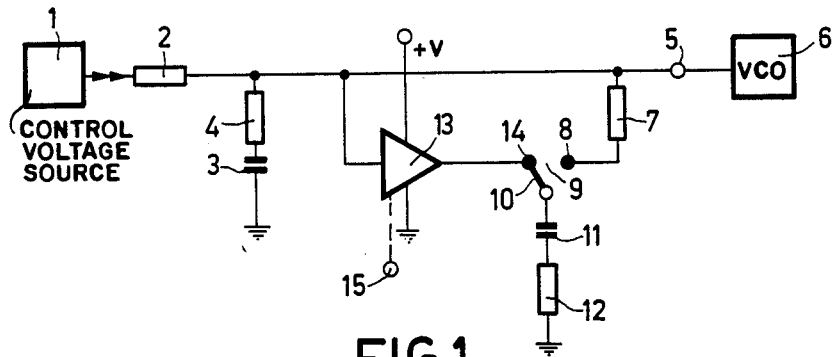
FIG. 1 shows a basic diagram of the circuit arrangement according to the invention.

In FIG. 1, a control voltage source 1 produces a d.c. voltage of the order of magnitude of some Volts, for example 6 Volts ±2 Volts. This d.c. voltage is applied via a series resistor 2 to a parallel branch which is connected to ground and comprises the series arrangement of a first capacitor 3 and an associated resistor 4. This branch may optionally also comprise further parallel branches of a similar construction or alternatively a parallel capacitor without series resistor.

The voltage occurring at the junction between the resistors 2 and 4 is applied to the output terminal 5 and from there to a stage to be controlled, for example a voltage-controlled oscillator 6. In addition, connected to the output terminal 5, there is a resistor 7 which is connected to a terminal 8 of a change-over switch 9, whose switching contact 10 is connected to ground via a second capacitor 11 of, for example, 4.7 $\mu$F, and optionally a resistor 12. The resistor 7 and the optional resistor 12 are connected as a second resistor in the current circuit of the capacitor 11, this capacitor 11 being active in the smoothing filter when the switching contact 10 of the change-over switch 9 is in the position not shown.

The high-impedance input of an amplifier 13, which is arranged between a 12 Volts supply terminal +V and ground, is connected to the junction between the resistors 2 and 4. The low impedance output of this amplifier 13 is connected to a second terminal 14 of the change-over switch 9. A voltage equal to the voltage present at the junction between the resistors 2 and 4 occurs at this contact 14, however with a lower impedance. The gain factor of the amplifier 13 is consequently at least substantially 1. This voltage is continuously applied to the capacitor 11 when the switching contact 10 of the change-over switch 9 is in the shown position. When thereafter the switch 9 is changed over, this voltage is conveyed to the output terminal 5 by the capacitor 11, it being obvious that then no disturbing voltage variations can occur.

The change-over switch 9 may be obviated and the capacitor 11 be permanently connected to the output of the amplifier 13 and in addition to the resistor 7, when the amplifier 13 can be switched between the gain factors 1 and zero by means of a switching voltage applied via a terminal 15 which is shown by means of a broken line. The contacts 8 and 14 are then permanently connected to the switching contact 10. At a gain factor of 1, the voltage transfer mentioned in the foregoing from the capacitor 3 to the capacitor 11 then occurs. Then there is no voltage difference between the capacitor 11 and the output terminal 5, and as a result thereof no current flows across the resistor 7. Therefore, the capacitor 11 is neither charged nor discharged and does not operate as a storing and smoothing device for the voltage at the output terminal 5. If, however the amplifier 13 is switched to the gain factor zero, its output becomes high-ohmic and the capacitor 11 is connected via the resistor 7 to the output terminal 5 and is operative in the smoothing filter. The resistor 7 may have a low resistance value since there is no voltage across it when the amplifier 13 is operative, so that it does not constitute a load on the circuit.

Figure 2:
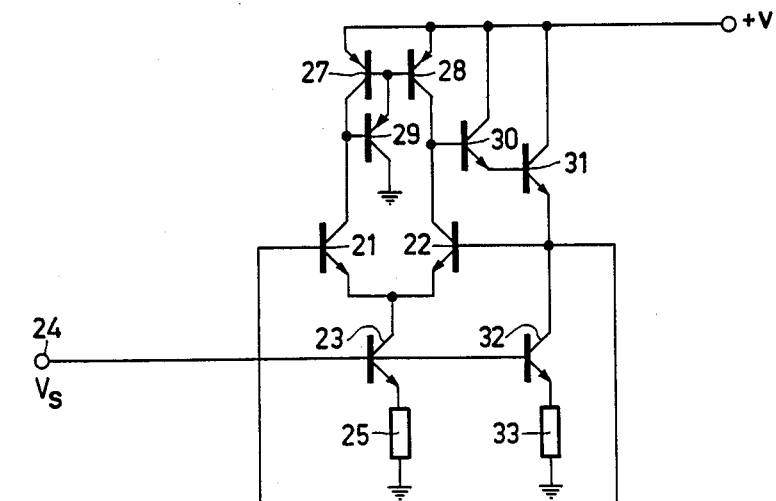
FIG. 2 shows a detailed circuit diagram with control by means of an applied voltage V.
Figure 2:
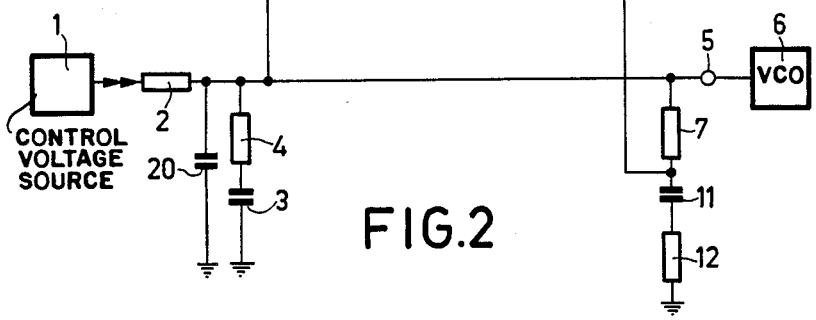

An embodiment of the circuit in accordance with the invention operating without a change-over switch is shown in FIG. 2, in which corresponding elements have been given the same reference numerals as in FIG. 1.

In this circuit, a further capacitor 20 for improving the smoothing properties is arranged in parallel with the series arrangement of the first capacitor 3 and the first resistor 4. The voltage produced at the output of resistor 2 and at the terminal 5 is applied to the base of a first npn-transistor 21, whose emitter is connected to the emitter of a second npn-transistor 22 and to the collector of a third npn-transistor 23. The base of the transistor 23 is connected to a terminal 24, to which a switching voltage $V_s$ is applied; the emitter of the transistor 23 is connected to ground via a resistor 25. The collectors of the transistors 21 and 22 are connected to the 12 Volts supply source +V via the collector-emitter path of two pnp-transistors 27 and 28, respectively. The collector of the transistor 27 is further connected to the base of a pnp-transistor 29, which has its emitter connected to the interconnected bases of the transistors 27 and 28, and its collector connected to ground. The transistors 27, 28 and 29 form a current mirror circuit by means of which the collector currents of the transistors 21 and 22 are kept equal.

The collector of the transistor 22 is further connected to the base of an npn-transistor 30, whose emitter drives the base of an npn-transistor 31, which has its emitter connected to the base of the transistor 22. The collectors of the transistors 30 and 31 are connected to the supply source +V. In addition, the collector-emitter path of an npn-transistor 32 having an emitter resistor 33, is connected between the base of the transistor 22 and ground. The base of the transistor 32 is connected to the terminal 24. The junction of the emitter of the transistor 31, the collector of the transistor 32 and the base of the transistor 22 is further connected to the junction of the capacitor 11 and the resistor 7.

When the transistor-amplifier circuit shown is operative in response to a switching voltage of, for example, +1 Volt applied to the terminal 24, the transistor 23 and 32 operate as current sources, on the one hand, for the differential amplifier 21, 22 and, on the other hand, for the emitter current branch of the dual emitter-follower 30,31. In this circuit it is ensured that the voltages at the bases of the transistors 21 and 22 are always accurately equal, the input of the transistor 21 being very high-ohmic and the base connection of the transistor 22 being very low-ohmic because of the action of the emitter follower 30, 31. The voltage occurring at the output terminal 5 is therefore always conveyed to the capacitor 11; no voltage difference occurs at the resistor 7. The capacitor 11 is, if so required, charged or discharged by the transistors 31, 30, 32, the maximum discharging current being determined by the current source 32, 33.

When the switching voltage $V_s$ at the terminal 24 is reduced to zero Volts, the amplifier comprising the transistors 21 to 32 is currentless and inoperative. Then the capacitor 11 with series resistor 12 is connected to the output terminal 5 via the resistor 7 and thus causes an increase of the time constant of the smoothing network.

What is claimed is:

1. An apparatus having an input terminal to which an input voltage, with respect to a reference potential, is applied, for providing a filtered output voltage, also with respect to said reference potential, at an output terminal of said apparatus, said apparatus having smoothing filter means coupled between said input and output terminals and being switchable between a first time constant and a second time constant in response to a switching signal, said smoothing filter means comprising:

a first branch having a first capacitor connected between said output terminal and said reference potential, said first branch providing said first time constant for said smoothing filter means;

a second branch having a resistor connected between said output terminal and a junction point and a second capacitor connected between said junction point and said reference potential, said second capacitor providing, in combination with said first capacitor in said first branch, said second time constant for said smoothing filter means; and isolation amplifier means having an input connected to said output terminal and an output connected to said junction point between said resistor and said second capacitor, said isolation amplifier means having a gain control input to which said switching signal is selectively applied for switching a gain of said isolation amplifier means between substantially unity and substantially zero, whereby, when the first time constant of said smoothing filter means is desirable, the gain of said isolation amplifier means is set to be substantially unity by said switching signal, in response to which, a voltage equal to that on said output terminal is applied by said isolation amplifier means to the junction point between said resistor and said second capacitor thereby effectively isolating said second capacitor in said second branch from said first capacitor in said first branch, and when the second time constant is then desired, the gain of said isolation amplifier means is changed to be substantially zero by said switching signal, in response to which, said second capacitor in said second branch, which initially, due to said isolation amplifier means, has a voltage equal to the output voltage impressed across it, is then coupled to said first capacitor in said first branch, whereby the combination of said first and second capacitors in said first and second branches provides the second time constant for said smoothing filter means.

2. The apparatus as claimed in claim 1, wherein said smoothing filter means further comprises a third branch having a third capacitor connected between said output terminal and said reference potential.

* * * * *